(12) United States Patent
Huang et al.

(10) Patent No.: US 8,514,556 B2
(45) Date of Patent: Aug. 20, 2013

(54) ELECTRONIC DEVICE WITH SUPPORT MECHANISM

(75) Inventors: Lian-Cheng Huang, Shenzhen (CN); Jian Li, Shenzhen (CN); Han-Zheng Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 77 days.

(21) Appl. No.: 13/160,648

(22) Filed: Jun. 15, 2011

(65) Prior Publication Data
US 2012/0106091 A1    May 3, 2012

(30) Foreign Application Priority Data
Oct. 28, 2010    (CN) .......................... 2010 1 0523069

(51) Int. Cl.
*H05K 7/16* (2006.01)
*F16M 11/20* (2006.01)

(52) U.S. Cl.
USPC ............... 361/679.21; 361/679.22; 361/679.3

(58) Field of Classification Search
USPC .................... 361/679.21, 679.22, 679.3, 727; 248/136, 188.8
See application file for complete search history.

(56) References Cited

U.S. PATENT DOCUMENTS

| | | | |
|---|---|---|---|
| 7,301,759 B2* | 11/2007 | Hsiung | 361/679.27 |
| 2005/0040311 A1* | 2/2005 | Lee | 248/454 |
| 2008/0225161 A1* | 9/2008 | Tsai et al. | 348/376 |
| 2008/0225172 A1* | 9/2008 | Chen | 348/569 |
| 2009/0168339 A1* | 7/2009 | Lee | 361/679.56 |
| 2009/0231785 A1* | 9/2009 | Li et al. | 361/679.01 |

FOREIGN PATENT DOCUMENTS

| CN | 101958948 A | * | 1/2011 |
|---|---|---|---|
| JP | 08141180 A | * | 6/1996 |
| JP | 3142358 U | * | 6/2008 |

* cited by examiner

*Primary Examiner* — Anatoly Vortman
*Assistant Examiner* — Jacob Crum
(74) *Attorney, Agent, or Firm* — Altis Law Group, Inc.

(57) ABSTRACT

An electronic device includes a support mechanism and a main body. The support mechanism includes a pivoting assembly and a support member. The pivoting assembly includes a fixing member, a sliding member slidably mounted on the fixing member, a pivoting shaft rotatably connected to one end of the fixing member, and at least one torsion spring sleeved on and coiling around the pivot shaft. The torsion spring includes two assembling legs, one assembling leg of the torsion spring elastically resists against the fixing member. The support member is fixed to the sliding member. when the support member is wholly received in the main body, one surface of the support member tightly contacts the main body via an elastic force generated by the torsion spring; and when the support member is moved away from the main body, the support member is rotated by the elastic force.

10 Claims, 4 Drawing Sheets

ELECTRONIC DEVICE WITH SUPPORT MECHANISM

BACKGROUND

1. Technical Field

This disclosure relates to support mechanisms, and particularly, to a support mechanism and an electronic device using the support mechanism.

2. Description of Related Art

An electronic device, such as a digital photo frame, or an e-book, often has a display screen and a support mechanism for supporting the display screen. A common support mechanism is a support rod hinged to the back surface of the display screen, and the support mechanism can adjust the inclination angle of the display screen relative to a plane of a table.

However, the support rod of the support mechanism often has a complex structure and consumes a large amount of space.

Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the present disclosure. Moreover, in the drawings like reference numerals designate corresponding parts throughout the several views. Wherever possible, the same reference numerals are used throughout the drawings to refer to the same or like elements of an embodiment.

DETAILED DESCRIPTION

Figure 1:
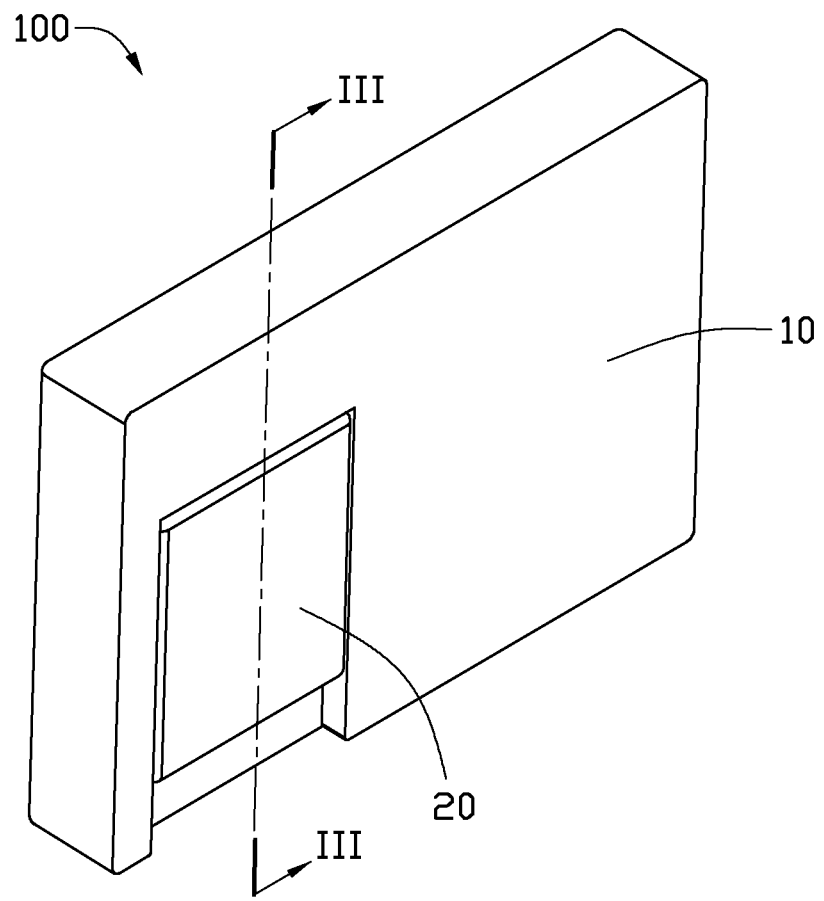
FIG. 1 is an assembled, isometric view of an embodiment of an electronic device having a support mechanism configured in an original state.
Figure 2:
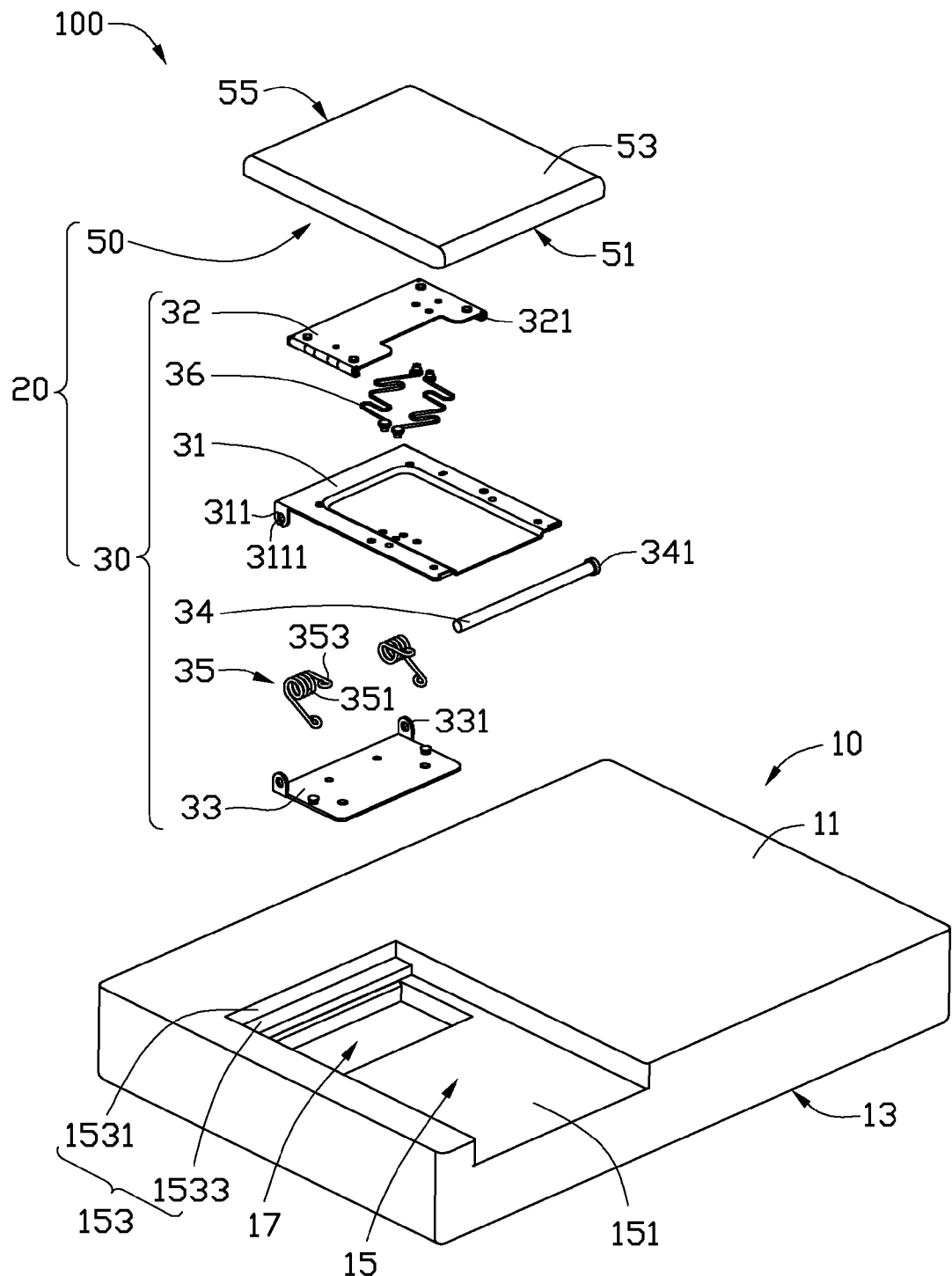
FIG. 2 is an exploded, isometric view of the electronic device of FIG. 1.

Referring to FIGS. 1 and 2, an embodiment of an electronic device 100 includes a main body 10, and a support mechanism 20 adjustably hinged to and received within the main body 10 when configured in an original state. The electronic device 100 can be a digital photo frame, an e-book, or an electronic game machine and the like. In the illustrated embodiment, the electronic device 100 is a digital photo frame.

The main body 10 is substantially rectangular-shaped, and includes a back support surface 11, and a front display surface 13 opposite to the back support surface 11. A concave portion 15 is recessed from the back support surface 11 of the main body 10 to receive the support mechanism 20 when the support mechanism 20 is not in use. In the embodiment, the concave portion 15 is substantially rectangular-shaped, and is positioned adjacent to one end of the back support surface 11 of the main body 10. The concave portion 15 includes a bottom surface 151 substantially parallel to the back support face 11 of the main body 10. One end of the concave portion 15 extends to one side of the main body 10. A substantially rectangular block-shaped stepped portion 153 is formed at the opposite other end of the concave portion 15. The stepped portion 153 includes a limit surface 1531 perpendicular to the bottom surface 151, and a blocking surface 1533 substantially parallel to the bottom surface 151 and substantially perpendicular to the limit surface 1531. A substantially rectangular assembling recess 17 is recessed from the bottom surface 151 of the concave portion 15 and positioned adjacent to the stepped portion 153.

The support mechanism 20 is adjustably hinged to the back support surface 11 of the main body 10 to support the main body 10 at a preset viewing angle when in use. In the illustrated embodiment, the support mechanism 20 includes a pivoting assembly 30 rotatably hinged to the main body 10 and partially received within the assembling recess 17, and a support member 50 hinged to the pivoting assembly 30 and selectively received within the concave portion 15 of the main body 10.

The pivoting assembly 30 includes a fixing member 31, a sliding member 32, a connecting member 33, a pivoting shaft 34, at least one torsion spring 35 and an elastic member 36. The fixing member 31 is a substantially rectangular board, and includes two pivoting portions 311 formed at two opposite ends (not labeled) of the fixing member 31. Each pivoting portion 311 defines a pivot hole 3111 therethrough.

The sliding member 32 is slidably mounted on the fixing member 31, and includes two sliding slots 321 defined at two opposite sides thereof for slidably assembling with two opposite sides (not labeled) of the fixing member 31.

The connecting member 33 is also a substantially rectangular plate, and is rotatably mounted to the fixing member 31. The sliding member 32 and the connecting member 33 are positioned at two sides of the fixing member 31. The connecting member 33 includes two hinged portions 331 formed at two opposite sides on one end of the connecting member 33.

The pivoting shaft 34 is rotatably connected to one end of the fixing member 31, with two ends thereof respectively hinged to the two pivoting portions 311 of the fixing member 31, and is further hinged with the sliding member 32 and the connecting member 33 together to the fixing member 31. A resisting flange 341 is formed at one end of the pivoting shaft 34 for preventing the fixing member 31 and the connecting member 33 detaching from the pivot shaft 34.

At least one torsion spring 35 is sleeved on and coiled around the pivot shaft 34. The torsion spring 35 includes a coil spring portion 351 and two assembling legs 353 respectively extending from two ends of the coil spring portion 351. In the illustrated embodiment, there are two torsion springs 35.

The elastic member 36 is assembled between the fixing member 31 and the sliding member 32 to provide an elastic force to the sliding member 32 and to enable the sliding member 32 to automatically go back or revert to its original position as the sliding member 32 is slid relative to the fixing member 31 during usage. In the embodiment, the elastic member 36 is wavy-shaped with one end thereof fixed to the fixing member 31, and the other end thereof fixed to the sliding member 32. The total number of the elastic member 36 is two. In alternative embodiments, the elastic member 36 can also be an arc-shaped or a volute-shaped spring.

The support member 50 is a substantially rectangular board having a shape substantially the same as the concave portion 15, such that, the support member 50 can be wholly received within the concave portion 15 of the main body 10 when configured in an original state, with one surface of the support member 50 being parallel to the back support surface 11 of the main body 10. In the illustrated embodiment, the support member 50 has a first surface 51, a second surface 53 opposite to the first surface 51, and two opposite end surfaces 55 connecting with two ends of the first and second surfaces 51, 53, respectively.

When assembling the support mechanism 20, the pivoting shaft 34 passes through the pivot hole 3111 of one pivoting portion 311 of the fixing member 31, one hinged portion 331 of the connecting member 33, the coil spring portion 351 of the torsion spring 35, the other hinged portion 331 of the connecting member 33, and the pivot hole 3111 of the other pivoting portion 311 in that order. Such that, the connecting member 33 is rotatably hinged to the fixing member 31 by the pivoting shaft 34. The two assembling legs 353 of the torsion spring 35 elastically resist against the fixing member 31 and the connecting member 33, respectively. The sliding member 32 is slidably mounted on the fixing member 31 with the two sliding slots 321 respectively engaging with the two sides of the fixing member 31. The elastic member 36 is elastically assembled between the sliding member 32 and the fixing member 31. Two ends of the elastic member 36 are respectively fixed to the sliding member 32 and the fixing member 31. The support member 50 is fixed to the sliding member 32 with the first surface 51 facing toward the sliding member 32 to finish the assembly of the support mechanism 20.

When assembling the electronic device 100, the connecting member 33 of the assembled support mechanism 20 is fixed to the bottom surface of the assembling recess 17 of the main body 10, and received within the assembling recess 17 together with the pivoting shaft 34 and the torsion spring 35 to finish the assembly of the electronic device 100. The pivoting shaft 34 is positioned adjacent to the stepped portion 153 of the concave portion 15 of the main body 10. The support member 50 together with the sliding member 32 and the fixing member 31 is received within the concave portion 15 of the main body 10. When the support member 50 is wholly received in the concave portion 15 of the main body 10, the first surface 51 of the support member 50 tightly contacts the blocking surface 1533 of the stepped portion 153 and/or the end surface 55 of the support member 50 tightly contacts the limit surface 1531 of the stepped portion 153 using the elastic force generated by the torsion spring 35. Thus the main body 10 securely holds the support member 50 in the concave portion 15 by the stepped portion 153, and therefore achieves a stable structure.

It is to be understood that the connecting member 33 can be omitted, as long as the pivoting shaft 34 passes through the pivot hole 3111 of one pivoting portion 311 of the fixing member 31, the coil spring portion 351 of the torsion spring 35, and the pivot hole 3111 of the other pivoting portion 311 in that order, and two ends of the pivoting shaft 34 are directly hinged to two opposite inner sidewalls of the assembling recess 17 of the main body 10, respectively.

It is to be understood that the limit surface 1531 of the stepped portion 153 is not limited to being perpendicular to the bottom surface 151, the limit surface 1531 can also be a slanted surface forming a slanted angle with the blocking surface 1533, such that, the first surface 51 of the support member 50 forms a slanted angle with the end surface 55 corresponding to the slanted angle formed by the limit surface 1531 and the blocking surface 1533.

Figure 3:
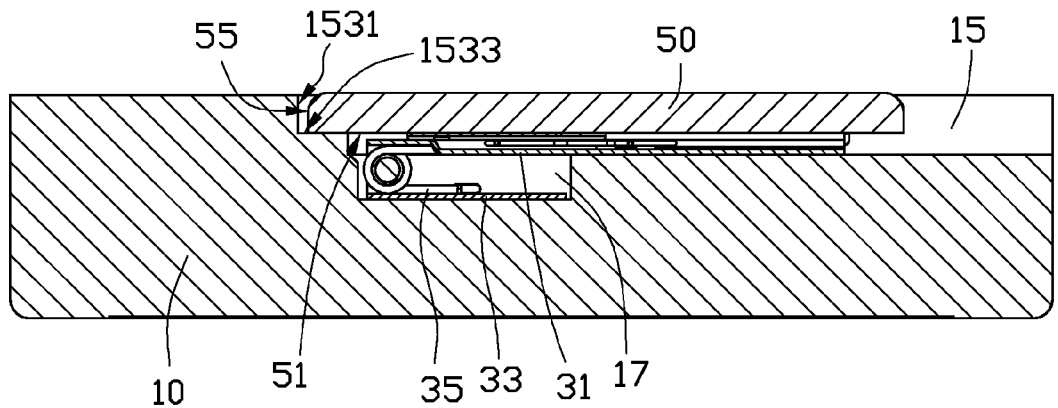
FIG. 3 is a cross-sectional view of the electronic device of FIG. 1, taken along line III-III.
Figure 4:
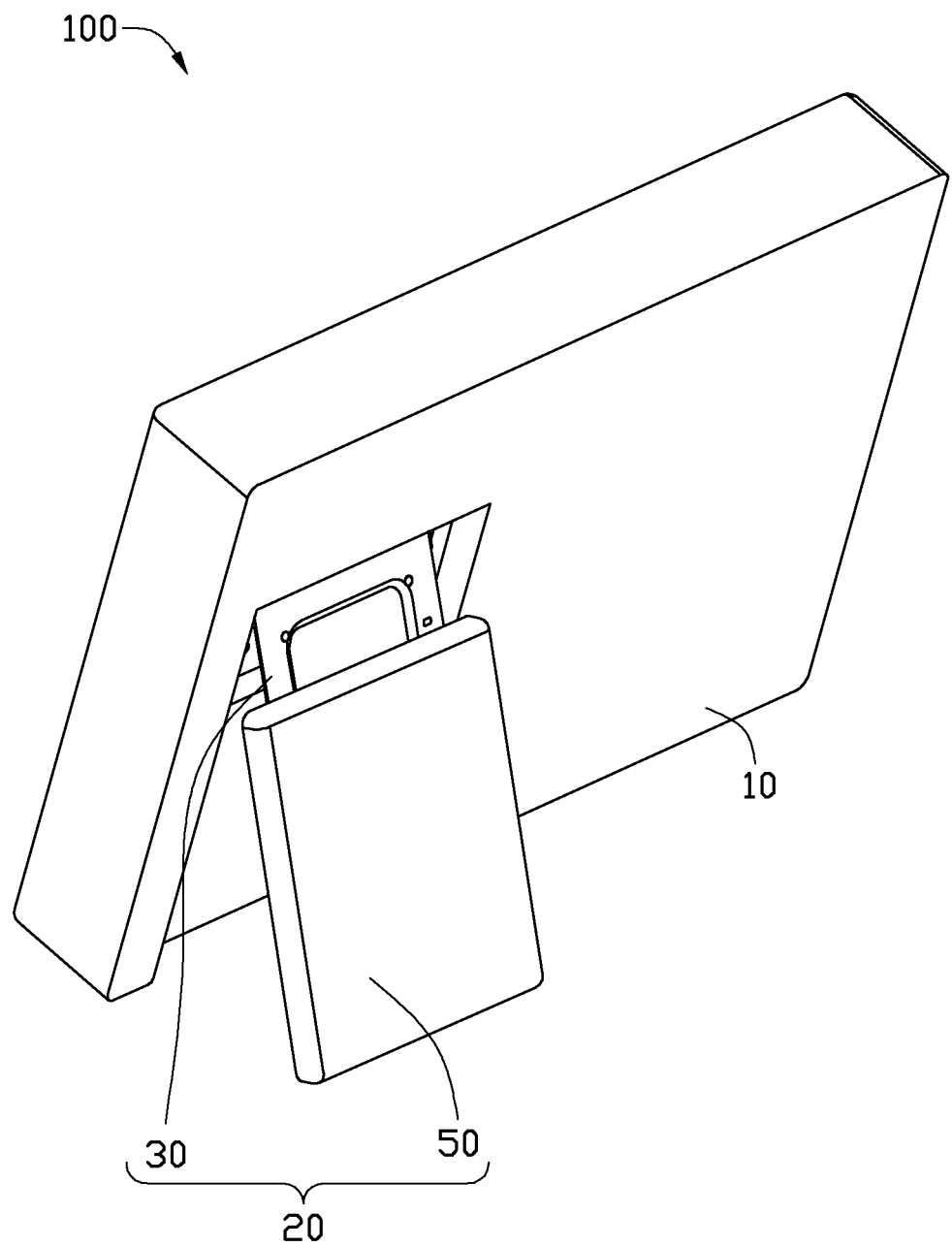
FIG. 4 is similar to FIG. 1, but showing the support mechanism configured in a working state.

Also referring to FIGS. 3 and 4, when the support member 50 of the electronic device 100 is in operation, the support member 50 is first pushed or moved away from the stepped portion 153 of the concave portion 15 together with the sliding member 32, relative to the fixing member 31. Then, the elastic member 36 is compressed to generate an elastic force for enabling the sliding member 32 to automatically go back or revert to its original position automatically when the support member 50 is unused. As the support member 50 slides away from the stepped portion 153, the support member 50 together with the fixing member 31 is rotated relative to the connecting member 33 and the back support surface 11 of the main body 10 by the torsion spring 35 to form a preset angle relative to the main body 10 for supporting the main body 10 and obtaining an optimal viewing angle of the front display surface 13.

It is to be understood, however, that even through numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device, comprising:
   a main body comprising a back support surface, and a front display surface opposite to the back support surface; the back support surface defining a concave portion having a bottom surface substantially parallel to the back support surface, and an assembling recess recessed from the bottom surface of the concave portion, wherein the concave portion comprises a bottom surface substantially parallel to the back support face and a stepped portion formed at one end of the concave portion, the stepped portion comprises a limit surface and a blocking surface connecting to the limit surface; and
   a support mechanism adjustably hinged to the back support surface of the main body to support the main body, and received within the concave portion of the main body when configured in an original state; the support mechanism comprising:
      a support member, and
      a pivoting assembly comprising:
         a fixing member;
         a sliding member slidably mounted on the fixing member, and fixed to the support member;
         a pivoting shaft rotatably hinged to the fixing member and assembled within the assembling recess of the main body; and
         a torsion spring sleeved on and coiling around the pivot shaft, the torsion spring comprising two assembling legs, one assembling leg of the torsion spring elastically resisting against the fixing member, the other assembling leg elastically resisting against the bottom surface of the assembling recess, wherein when the support member is wholly received in the concave portion, one surface of the support member tightly contacts the blocking surface via an elastic force generated by the torsion spring to securely hold the support member in the concave portion; and when the support member is pushed or moved away from the stepped portion, the support member is rotated relative to the main body by the elastic force generated by the torsion spring to form a preset angle relative to the main body for supporting the main body.

2. The electronic device of claim 1, wherein the opposite other end of the concave portion communicates with one side of the main body.

3. The electronic device of claim 2, wherein the assembling recess is positioned adjacent to the stepped portion, the limit surface is perpendicular to the bottom surface of the concave portion, and the blocking surface is parallel to the bottom surface of the concave portion and perpendicular to the limit surface.

4. The electronic device of claim 1, wherein the pivoting assembly further comprises a connecting member rotatably mounted to the fixing member by the pivoting shaft and further fixed to the bottom surface of the assembling recess, and received within the assembling recess together with the pivoting shaft and the torsion spring; the connecting member is positioned opposite to and away from the sliding member side.

5. The electronic device of claim 4, wherein the pivoting assembly further comprises an elastic member assembled between the fixing member and the sliding member for providing an elastic force to the sliding member and enabling the sliding member to go back to its original position automatically as the sliding member is slide relative to the fixing member during usage.

6. The electronic device of claim 5, wherein the connecting member comprises two hinged portions formed at two opposite sides on one end of the connecting member, and the two hinged portions are respectively hinged to two ends of the pivoting shaft.

7. The electronic device of claim 6, wherein the fixing member comprises two pivoting portions formed at two opposite sides on one end of the fixing member, each pivoting portion defines a pivot hole; the pivoting shaft is rotatably connected to one end of the fixing member, with two ends thereof respectively passing through the two pivot holes and hinged to the two pivoting portions of the fixing member.

8. The electronic device of claim 7, wherein the pivoting shaft further comprises a resisting flange formed at one end of the pivoting shaft.

9. The electronic device of claim 1, wherein the sliding member comprising two sliding slots oppositely defined at two sides thereof and respectively slidably assembling with two opposite sides of the fixing member.

10. The electronic device of claim 5, wherein the elastic member is wavy-shaped with one end thereof fixed to the fixing member, and the other end thereof fixed to the sliding member.

* * * * *